United States Patent [19]

Mack

[11] Patent Number: 5,363,171
[45] Date of Patent: Nov. 8, 1994

[54] PHOTOLITHOGRAPHY EXPOSURE TOOL AND METHOD FOR IN SITU PHOTORESIST MEASURMENTS AND EXPOSURE CONTROL

[75] Inventor: Chris A. Mack, Austin, Tex.

[73] Assignee: The United States of America as represented by The Director, National Security Agency, Ft. Meade, Md.

[21] Appl. No.: 98,914

[22] Filed: Jul. 29, 1993

[51] Int. Cl.⁵ ...................... G03B 27/74; G03B 27/80; G03B 27/42
[52] U.S. Cl. .......................................... 355/68; 355/53
[58] Field of Search .................... 355/53, 68; 250/330, 250/341; 356/432, 435

[56] References Cited

U.S. PATENT DOCUMENTS

| | | | |
|---|---|---|---|
| 3,951,546 | 4/1976 | Markle | 355/51 |
| 4,068,947 | 1/1978 | Buckely et al. | 355/72 |
| 4,206,494 | 6/1980 | Lovering | 362/32 |
| 4,425,037 | 1/1984 | Hershel et al. | 355/43 |
| 4,616,908 | 10/1986 | King | 350/576 |
| 5,077,475 | 12/1991 | Moriya et al. | 250/330 |
| 5,185,645 | 2/1993 | Sartorius et al. | 356/435 |
| 5,198,857 | 3/1993 | Goto | 355/53 |

OTHER PUBLICATIONS

Prolith/2, version 2.2 for the PC, Finle Technologies.
Hickman et al., "Use of diffracted light from latent images to improve lithography control," SPIE, 1464: 245-257, 1991.
Bishop et al., "Use of Scatterometry for Resist Processing Control," SPIE, 1673: 441-452, 1992.
Milner et al., "Latent image exposure monitor using scatterometry," SPIE, 1673: 274-283, 1992.
Dill et al., "Characterization of Positive Photoresist," IEEE Transactions on Electron Devices, ED-22(7): 445-452, 1975.

Primary Examiner—Richard A. Wintercorn
Attorney, Agent, or Firm—Arnold, White & Durkee

[57] ABSTRACT

An apparatus and method is provided for measuring photoresist parameters in situ is disclosed. Transmission and reflectivity detectors are used in a lithographic exposure tool to obtain in situ absorption parameters and reflectivity data. The absorption parameters and reflectivity data are used in a feedback control system that controls the exposure dose used in the lithographic tool.

9 Claims, 8 Drawing Sheets

PHOTOLITHOGRAPHY EXPOSURE TOOL AND METHOD FOR IN SITU PHOTORESIST MEASUREMENTS AND EXPOSURE CONTROL

BACKGROUND OF THE INVENTION

The present invention relates to photolithographic imaging. More particularly, the invention relates to apparatus and methods for measuring various optical and kinetic variables in a photoresist masking process to characterize the process and to control the operation of the equipment used in the process.

Photoresist masking is employed in a variety of photolithography or optical lithography processes. Generally, a photolithography exposure tool projects an image into a photosensitive layer placed on a substrate. For example, an integrated circuit is built from numerous layers formed on a substrate, many such layers defined through photolithographic imaging. In addition to integrated circuit manufacturing, photoresist masking is used in other manufacturing applications such as for forming flat panel displays, thin film magnetic disk heads, optoelectrical devices, micro-manufacturing and advanced packaging.

The pattern that is projected into the photosensitive layer is contained on a mask that is placed within the photolithography exposure tool. The mask may, as in integrated circuit manufacturing, for example, be made from patterned chrome placed on glass. The pattern is transferred onto the substrate by projecting an image of the mask onto a photosensitive layer placed on the substrate. For integrated circuits, the photosensitive layer is generally a photoresist layer placed on a semiconductor wafer. Typically photoresist comprises nonvolatile materials, including a polymer resin and a photo active agent, dissolved or otherwise dispersed within a volatile solvent.

Many different types of tools can be used to project an image of the mask onto a substrate. U.S. Pat. Nos. 3,951,546 and 4,068,947 describe a tool which scans a slit of light across the mask, through an annular unit magnification optical projection system onto a wafer. The disclosure of both these patents is expressly incorporated herein by reference. This tool, commonly known as a scanner, generally uses a broadband light source with a selectable wavelength range and a fixed degree of coherence and has a catoptric or a catadioptric optical system with a fixed numerical aperture.

Another type of photolithography tool exposes a small area of a wafer at one time. The wafer is then stepped to a new location and the exposure is repeated. This type of tool is called a step-and-repeat projection system, or stepper. U.S. Pat. No. 4,425,037, the disclosure of which is expressly incorporated herein by reference, describes a unit magnification stepper with a broadband light source of fixed wavelength range and coherence and fixed numerical aperture. Other steppers are reduction projection systems in which the mask size is larger by a fixed factor than the printed image. These systems generally employ a fixed monochromatic light source, such as that disclosed in U.S. Pat. No. 4,206,494, and a sophisticated objective lens such as that disclosed in U.S. Pat. No. 4,616,908, the disclosures of each of which are expressly incorporated herein by reference. All of the above-mentioned types of photolithography exposure tools are used to selectively expose a photoresist coated substrate, a wafer, generally placed on substrate holder, such as a vacuum chuck, within the tool.

The photoresist itself is an important part of the overall optical process and the absorption of light by the photoresist will impact the amount of energy transferred from the photolithography tool to the photoresist. Furthermore, the reflectivity of the materials underlying the photoresist will effect the amount of energy transferred to the photoresist. Thus, it would be desirable for a photolithography exposure tool to adjust illumination in response to the amount of absorption of light by the photoresist and the reflectivity of the underlying substrate.

The absorption of energy by photoresist is dependent on a number of factors. Photoresist chemical components and structures vary between different commercial photoresist suppliers, thus effecting the amount of absorption. Also, batch to batch variation exists even from one supplier. Further variation can be added by photoresist pretreatment, such as a prebake used to dry the resist, prior to exposure. Prebake variables such as time and temperature can ultimately effect the absorption of light by photoresist. Photoresist thickness, the photoresist age and the time between photoresist coating and exposure will also add variation. Furthermore, absorption of energy by photoresist decreases as the photoresist is exposed to light, therefore adding an exposure dependent factor.

Thus the absorption of energy by photoresist is a complicated system dependent on many factors. In order to characterize photoresist absorption, various characterization coefficients and constants are known to those skilled in the art. Typically such characterization parameters are calculated by measuring the transmission of light through a photoresist coated glass substrate. As an example, for positive photoresist, absorption has been characterized by calculating photoresist parameters such as exposure dependent or bleachable resist absorption coefficient A, exposure independent or non-bleachable resist absorption coefficient B, and optical sensitivity or resist kinetic exposure rate constant C. Equations for such parameters are known in the art and shown in Equations 1–3, $$A = (1/d)\ln[T(\infty)/T(0)] \quad \text{Eq. 1}$$

$$B = -(1/d)\ln T(\infty) \quad \text{Eq. 2}$$

$$C = \frac{A + B}{AI_0 T(0)\{1 - T(0)\}} \frac{dT(0)}{dt} \quad \text{Eq. 3}$$

where d is the photoresist thickness, T(0) is the internal transmittance of the photoresist before exposure, T(∞) is the internal transmittance of completely exposed photoresist, and $I_o$ is the illuminating source intensity. Other characterization equations may also be used. For example with polysilane photoresist, non-linear bleaching properties have been reported as shown in Equation 4.

$$A = [0.5 + 1.4(M_c - 0.4)]A_c \quad \text{Eq. 4.}$$

where A is the bleachable absorption coefficient $M_c$ is the concentration of unbleached polysilane with an absorbance of $A_c$.

The reflectivity of the material underlying the photoresist is another variable that impacts the amount of energy delivered to the photoresist. A more reflective substrate under the photoresist will result in higher energy levels being delivered to the photoresist. For example, during integrated circuit manufacturing a variety of films may be stacked on the substrate. The reflectivity of the combination of the substrate and stacked films can vary between manufacturing steps because different films are on the substrate during different steps. The reflectivity may even vary at the same manufacturing step because the film thickness or properties may vary from substrate to substrate or batch to batch.

Reflectivity measurements are generally used in photolithography for matching the photoresist thickness to the reflectivity and for measuring film thickness. Currently, however, reflectivity is not measured by the projection tool, but rather by separate off-line specialized instruments that are commercially available such as the Nanometrix Nanospec, Prometrix FT 500, and Tencor TF. Because reflectivity affects the ability of a photolithography exposure tool to deliver a constant energy into the photoresist, it is desirable to more directly utilize this information to characterize photoresist and to control the exposure energy delivered by a photolithography exposure tool.

The goal of each photolithography tool is to deliver precisely controlled amounts of energy into the photoresist. The most common lithographic result which must be controlled is the linewidth of critical dimensions that are printed on a substrate. Typically the amount of energy delivered to the photoresist, and thus the critical dimension printed, is adjusted by setting the photolithography exposure tool to a fixed exposure time. A constant lithographic result, however, is difficult to achieve in the face of changes in the properties of the lithographic tool, the photoresist and the substrate.

Characterization parameters and methods are generally used for photoresist modeling and research. Currently, these parameters are not measured by the photolithography exposure tool, but rather by separate off-line specialized instruments, one such instrument is the PACScan is commercially available from Site Services. It would be desirable to measure characterization parameters in situ using the photolithography exposure tool because these parameters affect the ability of a photolithography exposure tool to deliver a constant energy into the photoresist.

The in-situ measurement apparatus and methods of the present invention provide more accurate photoresist and reflectivity measurements compared to prior methods because in accordance with the present invention, the present inventor has recognized that accuracy is increased when the measurements are made with the photolithography exposure tool that is used to expose the lithographic pattern rather than with a separate off-line instrument. In accordance with the present invention, the present inventor has also recognized that by improving the accuracy of these measurements, the resulting data may be used to control the exposure of the photolithography tool. The resist parameters and reflectivity measurements obtained from separate off-line specialized tools have several problems. First, the light sources used for the resist and reflectivity measurements are not calibrated to the light source used in the exposure tool. Also, the calibration would have to be constantly updated and would suffer from inaccuracies because the optical properties of the light sources change over time. For example, light intensity changes between sources and with time. Also, in broadband sources the spectral output, i.e. intensity vs. wavelength, changes between sources and with time. The reflectivity measurement would pose additional problems because a measured reflectivity value is a function of the numerical aperture of the illumination source. Thus, unless the numerical aperture of the measurement device is the same as that of the photolithography exposure tool, and it usually is not, the measurement will suffer from inaccuracies. Furthermore, detectors on different tools may give different measurements, because the measurement accuracy of detectors changes as the light source wavelength output varies, especially for broadband sources. The in situ measurement apparatus and methods of the present invention eliminate these problems.

Generally existing tools emphasize controlling the energy directed toward the substrate by using a set light intensity and varying the exposure time. An exposure time is typically set based on prior experience of the user or by measuring the resulting critical dimensions on a test substrate to determine the exposure for production substrate. More accurate lithographic results, though, would result from controlling exposure time in response to the actual energy absorbed by the photoresist, thus compensating for changing properties in the lithographic process. Present photolithography exposure tools fail to adequately compensate for the changing lithographic properties and thus linewidth accuracy is lost.

A closed loop in situ method for exposing photoresist is disclosed in "Use of Diffracted Light From Latent Images to Improve Lithography Control," SPIE Vo. 1464 Integrated Circuit Metrology, Inspection, and Process Control V, p. 245–57(1991). This method utilizes the latent image of a diffraction grating that is projected into photoresist on a wafer. Laser light is directed towards the grating during exposure. The intensity of the light diffracted from the latent image is measured during exposure. The diffracted intensity varies with the exposure because as more energy is delivered to the photoresist, the refractive index of the photoresist changes. When the measured diffracted intensity reaches a predetermined limit, exposure is halted. Thus, exposure control becomes dependent on an in situ measurement.

This latent image method has several disadvantages. First, the absorption of light by the photoresist is not directly measured, but rather is only indirectly measured by the change in refractive index. The latent image method does not adequately account for bleachable absorption coefficients and non-bleachable absorption coefficients. It is desirable to directly measure absorption so that the photoresist can be fully characterized such as, for example, by using the characterization equations presented above and so that exposure control may be more directly related to the absorption of energy by the photoresist. The latent image method also requires a diffraction grating pattern to be added to lithographic process. In addition, another light source, the laser, is required, thus adding components and potential calibration inaccuracies. Finally, it is desirable to provide a more direct method to compensate for substrate reflectivity variations.

SUMMARY OF THE INVENTION

The apparatus and methods of the present invention are directed at the problems outlined above. More particularly, the apparatus of the present invention is a photolithography exposure apparatus incorporating an imaging system for projecting an image from a mask onto a photosensitive layer. The apparatus includes a transmission detector and computer for calculating photoresist absorption parameters. The apparatus may also include a reflectance detector for measuring illumination that reflects from the photosensitive layer. A beam splitter may be used to direct the reflected illumination.

One method of the present invention is a method of characterizing a photolithography process by measuring light transmission of a photosensitive layer and calculating absorption parameters of the layer. Reflectivity measurements may also be made in the characterization method.

Another embodiment of the present invention is a method for measuring and controlling an exposure of a photosensitive layer. Reflectivity data may be measured and used to calculate an exposure. An image may then be exposed under control of the calculated exposure. Alternatively, reference reflectivity data may be collected and used to calculate absorption parameters that are then used for calculating an exposure. With either method, a closed loop system of exposure may also be used such that reflectivity measurements are obtained during an exposure and used to control the exposure. Absorption parameters may also be calculated during the exposure and used to control the exposure.

In yet another embodiment, a method of controlling an exposure of a photosensitive layer is presented. In this method, light transmission data is collected and used to calculate absorption parameters. An exposure is then calculated using the absorption parameters and an image is exposed under control of the calculated exposure. Reflectivity data may also be collected in addition to the transmission data, and an exposure may be calculated using both the reflectivity and transmission data. Finally, closed loop exposure control may be utilized by measuring reflectivity data during exposure, calculating an exposure and exposing an image under control of the calculated exposure.

DETAILED DESCRIPTION OF THE PREFERRED EMBODIMENTS

In order to more accurately characterize photoresist and control the exposure energy delivered into photoresist, and therefore the critical dimension linewidth, the present invention presents an apparatus and methods that compensates for changes in the photolithography exposure tool, photoresist and underlying substrate.

Figure 1:
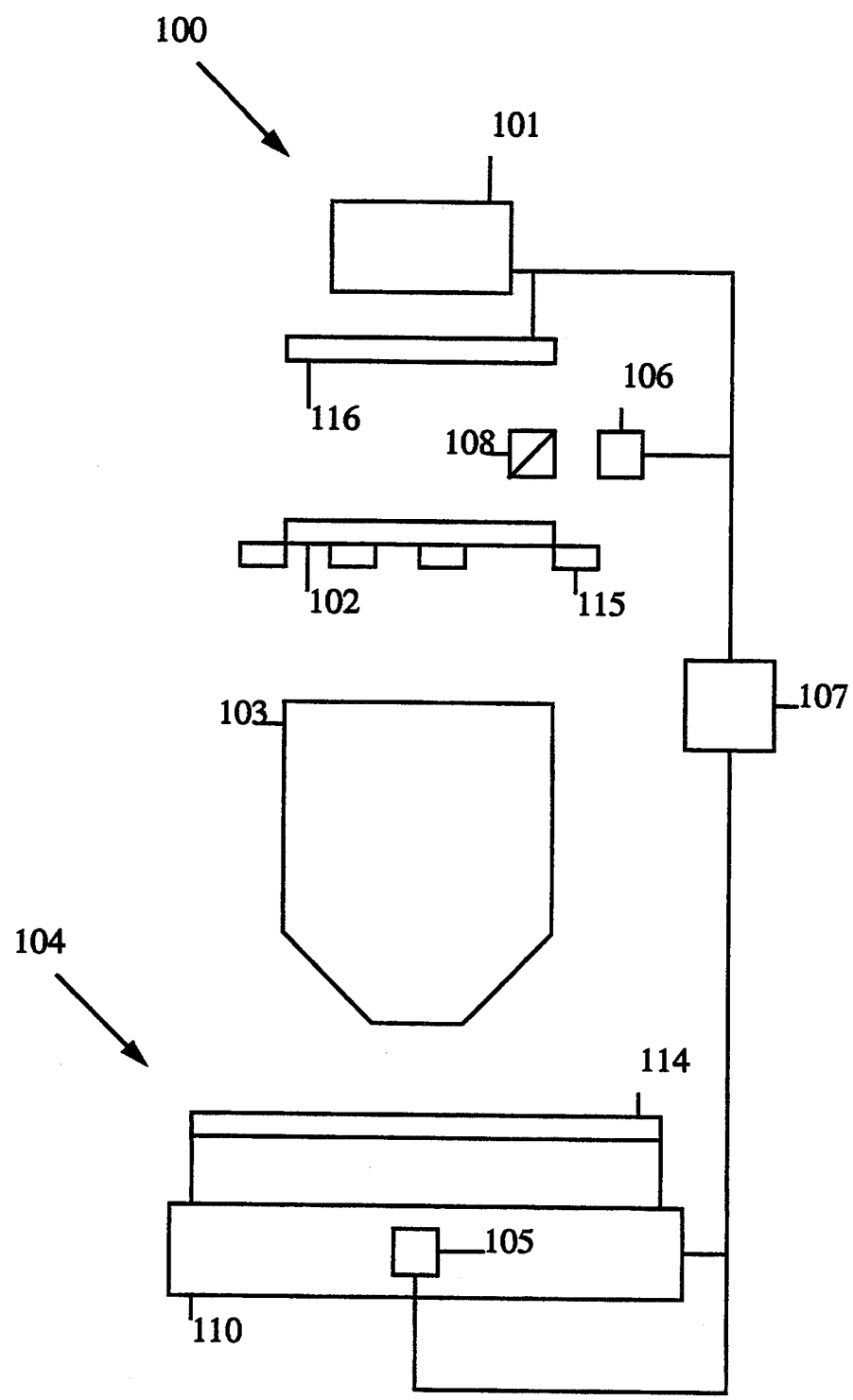
FIG. 1 is a schematic sectional view of a photolithography exposure tool according to the present invention.

FIG. 1 is a photolithography exposure tool utilizing in situ or on-line measurement of photoresist and reflectivity optical properties in accordance with the present invention. Photolithography tool 100 is comprised of illumination source 101, objective lens 103, vacuum chuck 110 or other suitable means to hold a photoresist coated substrate 104. Photolithography tool 100 also includes transmission detector 105, reflectance detector 106, control electronics/computer 107, and beam splitter 108 for redirecting the reflected light. Mask 102 contains the pattern that is desired to be projected into photoresist layer 114 on photoresist coated wafer 104. Mask 102 is supported by mask support 115 or other suitable support means known in the art. There are many types of photolithography exposure tools in many different configurations. The configuration used in FIG. 1 is shown for demonstrative purposes only and the present invention is not to limited to such a configuration. Photolithography exposure tool 100 also has shutter 116 to control the exposure time. Shutter 116 is shown to illustrate one method of controlling exposure time as known in the art. The present invention may also be utilized with the other methods to control exposure known in the art, such as, for example, those used in scanner exposure tools. The present invention is compatible with many different photolithography exposure tools and configurations and in a general embodiment comprises a system and method for in-situ photoresist characterization and for controlling the exposure energy delivered into photoresist by an exposure tool in response to in-situ measurements of photoresist and reflectivity optical properties.

Control electronics/computer 107 may be part of the standard electronics within a photolithography tool. For example, many exposure tools are integrated with a computer and the chuck, shutter, illumination source, etc. are all controlled together by the computer. Alternatively, control electronics/computer 107 may be a separate computer used to collect data from transmission detector 105 and reflectance detector 106 and to perform calculations from the data. Control electronics/computer 107 would then interface with the electronics of the exposure tool.

A variety of detectors are available to use as transmission detector 105 and reflectance detector 106. Generally the same model of an optical detector may be used for both transmission measurements and reflectance measurements. Such detectors are commercially available and as known by those skilled in the art.

The optical properties that may be measured using photolithography exposure tool 100 include the transmission and absorption of light by the photoresist. Light transmission and absorption is typically measured by coating photoresist on to a special glass substrate or other transparent substrate. In general, the back side of this substrate will be coated with an appropriate anti-reflective layer. The substrate is then placed in the photolithography exposure tool 100 and held by vacuum chuck 110. In one embodiment, vacuum chuck 110 may be the chuck used to support the substrate during photolithographic patterning. However, chuck 110 may also be a chuck primarily used for substrate handling or a substrate loading and unloading mechanism. Alternatively, a chuck may be specifically designed for use with the present invention. When exposure commences transmission detector 105 measures the transmission and absorption of light through the resist coated glass substrate. Transmission detector 105 may be built into chuck 110 as shown in FIG. 1, however, this is not required. For example, transmission detector 105 could be placed under a viewport or hole in chuck 110 so that transmission detector 105 is positioned such that the transmission of light through the resist coated glass wafer can be detected.

To perform the transmission and absorption measurement, the area above transmission detector 105 is uniformly illuminated by illumination source 101. Transmission detector 105 is illuminated by positioning it such that the detector location corresponds with a clear area of mask 102. Alternatively, mask 102 may be removed during such measurements. Transmission detector 105 collects energy intensity versus time data as the exposure proceeds and transmits this information to computer 107. The transmission and absorption data collected is then analyzed in computer 107 to determine various photoresist coefficients and constants. For example, a bleachable resist absorption coefficient, a nonbleachable resist absorption coefficient, and a resist kinetic exposure rate constant may be calculated. If desired, multiple detectors or multiple measurements in different locations of a substrate made by a single detector could be used to perform several measurements in order to improve the measurement accuracy. Separate values could even be calculated for different locations across the substrate.

For reflectance measurements, either an actual production substrate or a test substrate may be used. If a test substrate is used, the test substrate would typically simulate the films or layers of a production substrate. By coating resist on the substrate, a film stack is created which includes the basic substrate, any films or layers added during prior processing steps, and the photoresist. A small area of substrate 104 is then illuminated using a clear area of mask 102. For a production substrate, this area may be located in an unused portion of the substrate such as the scribe line for semiconductor wafers.

When illuminated, light reflects off the film stack and back up through lens 103. Reflectance detector 106 is used to measure the reflected light intensity. Reflectance detector 106 can be placed in the path of the reflected light in a number of ways. In one embodiment, beam splitter 108 is placed in the reflected light path to direct a fixed portion of the light to the detector. Other methods of collecting the reflected light are readily apparent to those skilled in the art. Reflectance detector 106 may measure the reflected light intensity as a function of exposure time. This data is recorded in computer 107 which correlates film stack reflectivity and exposure time. Furthermore, if a reference reflectivity of the film stack without the photoresist layer is known, photoresist absorption parameters can also be calculated from the reflectance data of the resist coated film stack. The reference reflectivity may also be obtained from a test substrate that simulates the reflectivity of actual production substrates.

Photoresist absorption parameters may, thus, be calculated utilizing the relationship between absorption and transmission. However, absorption parameter equations calculated from reflectivity data are generally more complicated than the equations shown in Equations 1-3 because additional interface effects should be considered. Also, light interference between the direct light and reflected light, will effect the calculation. Thus it can be shown that the A and B coefficients from Equations 1 and 2 may be calculated from the reflectivity versus exposure data and approximated by Equations 5 and 6:

$$B = -\frac{1}{D} \ln\left[\sqrt{\frac{R_{12}}{R_{23}}} \left(\frac{1 - R(\infty)}{1 - R_{12}R(\infty)}\right)\left(\sqrt{1 + \left(\frac{1 - R_{12}R(\infty)}{1 - R(\infty)}\right)\left(\frac{R(\infty) - R_{12}}{R_{12} - R_{12}R(\infty)}\right)} - 1\right)\right] \quad \text{Eq. 5}$$

$$A + B = -\frac{1}{D} \ln\left[\sqrt{\frac{R_{12}}{R_{23}}} \left(\frac{1 - R(0)}{1 - R_{12}R(0)}\right)\left(\sqrt{1 + \left(\frac{1 - R_{12}R(0)}{1 - R(0)}\right)\left(\frac{R(0) - R_{12}}{R_{12} - R_{12}R(0)}\right)} - 1\right)\right] \quad \text{Eq. 6}$$

where
D = resist thickness, adjusted to give a maximum of the reflectivity swing curve
$R_{12}$ = reflectivity of the air-resist interface
$R_{23}$ reflectivity of the substrate
R(0) = reflectivity of the resist coated substrate at no exposure
R($\infty$) = reflectivity of the resist coated substrate after complete exposure A constant C, as shown in Equation 3, may also be obtained by curve fitting reflectivity data. Thus, photoresist absorption parameters can be measured from reflectivity calculations on production substrates, as opposed to using a special glass substrate.

Exposure control, using either open or closed loop feedback, may be based on the in situ measurements. FIGS. 2-8 present flow charts of the method of operation of the apparatus of FIG. 1 to perform the absorption measurements, reflectance measurements, and the exposure control of the present invention. In practice, the steps shown in the flow charts of FIGS. 2-8 are programmed in an appropriate language, and loaded into the program memory of control electronics/computer 107, in order to control photolithography exposure tool 100 to perform the function desired.

Figure 2:
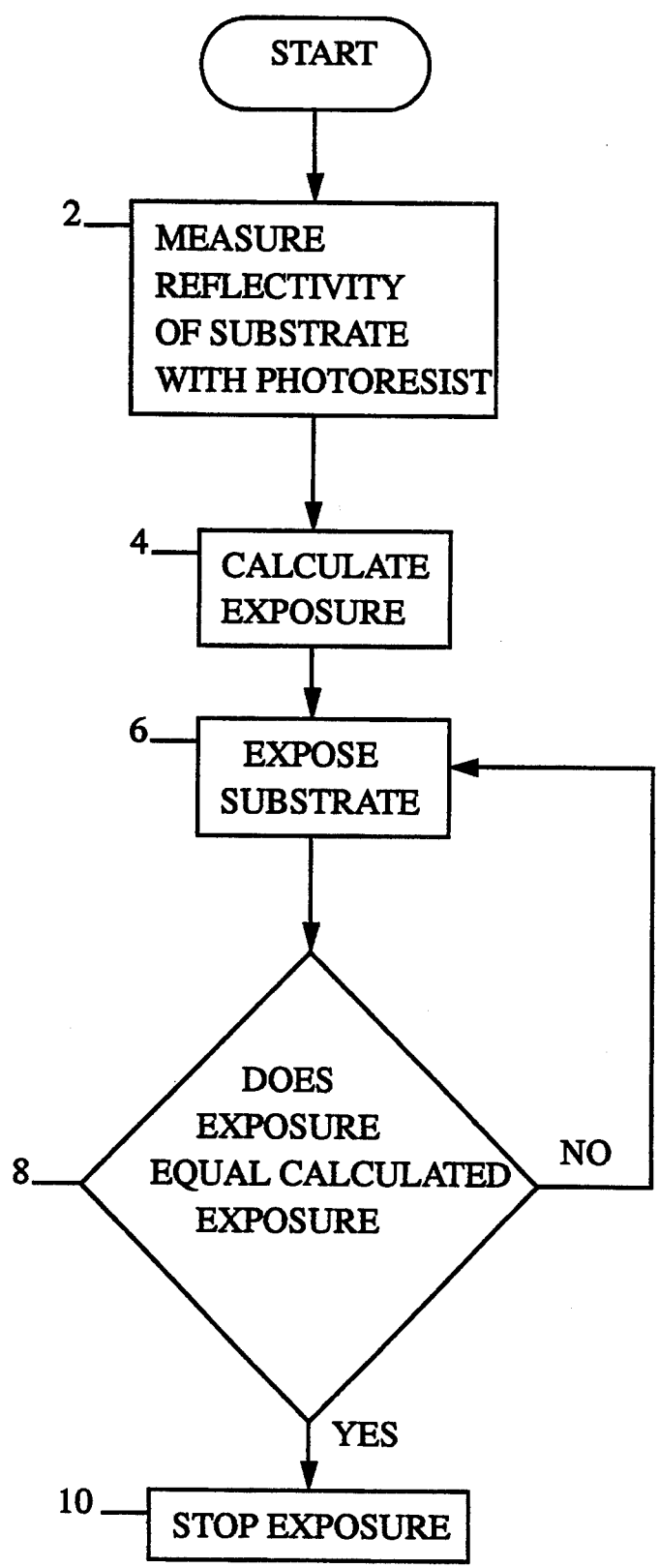
FIG. 2 is a flow chart of an exposure control method used by the tool in FIG. 1 according to the present invention.

In FIG. 2 a generalized flow chart of one method of the present invention is presented. First, the reflectivity as a function of exposure time of the entire film stack, including photoresist, is measured in block 2. The reflectivity measurement in block 2 may be made using a test substrate or a small area of a production substrate as described above. Measured reflectivity data from block 2 is used by computer 107 to calculate a required exposure in block 4. Preferably, the required exposure is calculated as a function of time such that in block 4 an exposure time for shutter 116 is generated. However, alternate embodiments will be recognized by those skilled in the art. For example, block 4 may calculate a scan speed if a scanning photolithography tool is used, the number of laser pulses if an excimer laser is used or the intensity of illumination source 101.

The required exposure is calculated in block 4 by utilizing the measurements from block 2 in conjunction with predetermined baseline data that is stored in the memory of computer 107. The baseline data is determined by projecting the pattern in mask 102 onto a test substrate at a variety of exposures, such as a series of increasing exposure times (an exposure matrix). During these exposures, reflectivity data is collected and stored in computer 107. Then, the optimal baseline exposure time is determined from the exposure matrix by analyzing standard lithographic results on the substrate such as critical dimension linewidth. The magnitude of the reflectivity and/or the total reflectance measured at the optimal baseline exposure time is then retrieved and stored for use in calculation block 4. The total reflectance is the integral of the reflectance versus time curve obtained from the collected baseline reflectivity data.

The reflectivity magnitude and/or total reflectance from the baseline data is matched in calculation block 4 with the current measured reflectivity from block 2. The required exposure time is, thus, calculated in block 4 by selecting the time from block 2 that generated a reflectivity magnitude value, total reflectance value or combination of the two values that was substantially equivalent to the values from the baseline data at the optimal exposure time.

Exposure then begins in block 6 and is compared to the calculated exposure in decision block 8. When the accumulated exposure reaches the calculated exposure, control proceeds to exposure stop block 12 where shutter 116 or other exposure control means halts exposure.

Figure 3:
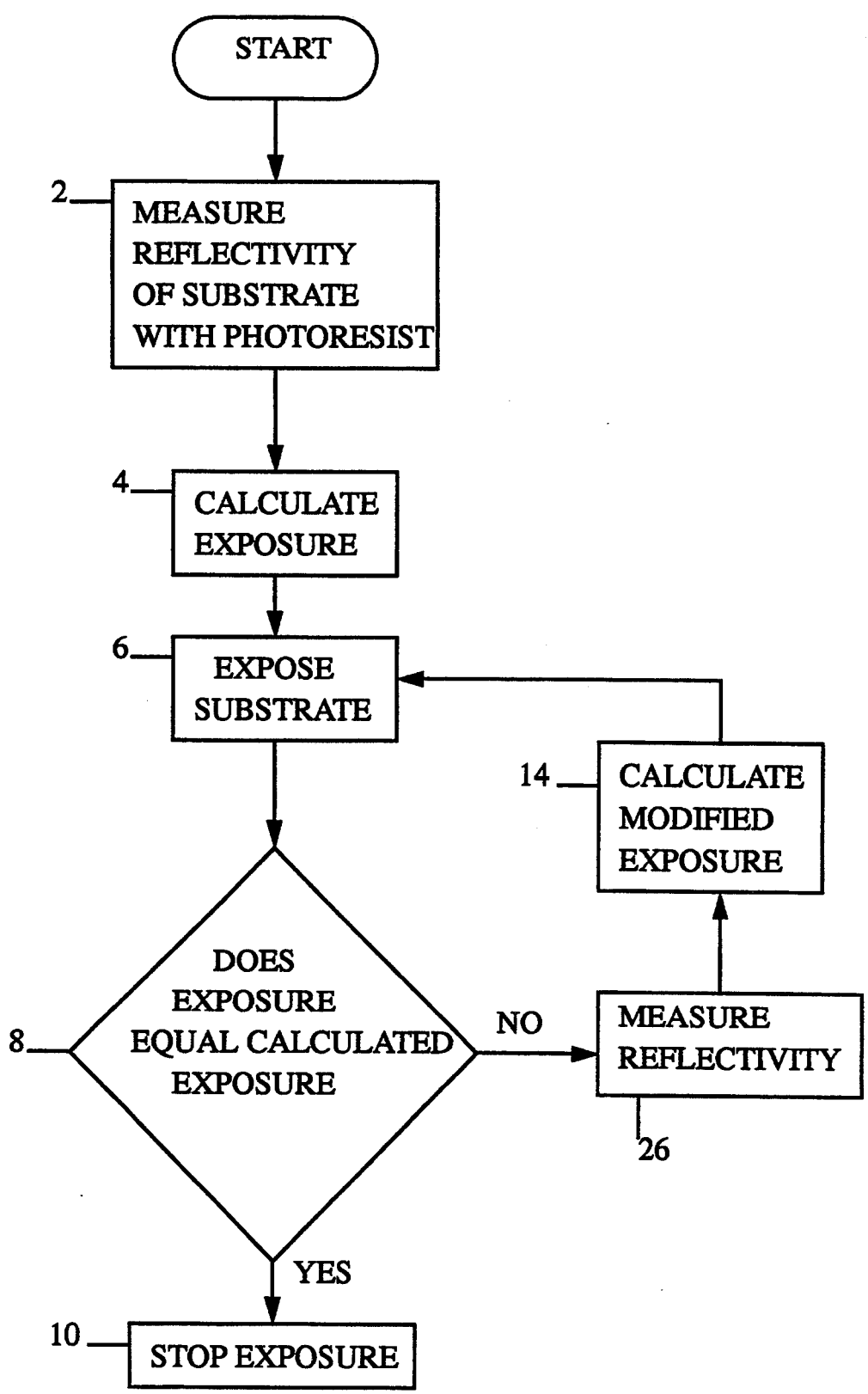
FIG. 3 is another embodiment of the exposure control method in FIG. 2.

The control method shown in FIG. 2 is modified in FIG. 3 by adding closed loop exposure control feedback. Control proceeds in FIG. 3 similar to FIG. 2 until decision block 8 is reached. If the actual exposure has not reached the calculated exposure, control passes to measurement block 26. Reflectivity data is measured in block 26 during the exposure. Control then passes to calculation block 14. In calculation block 14, the reflectivity measurements from block 26 are compared to the optimal reflectivity values from baseline data in order to calculate an exposure time. The calculation procedure in block 14 is, thus, similar to the procedure in calculation block 4. If the new reflectivity data from block 26 indicates that a modified exposure time is warranted, then a modified exposure time is calculated and stored in computer 107. Control then returns to exposure block 6 and actual exposure is again compared to calculated exposure in decision block 8. The loop continues until, as before, the required exposure is achieved and control passes to exposure stop block 10.

Figure 4:
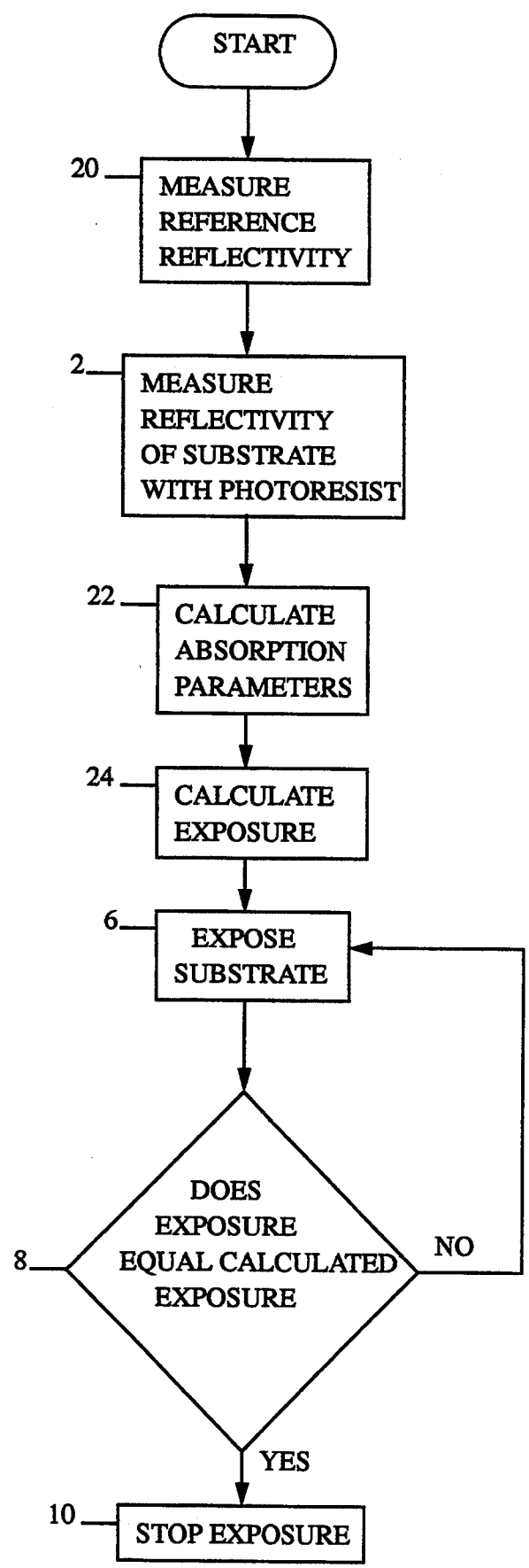
FIG. 4 is another embodiment of an exposure control method used by the tool in FIG. 1 according to the present invention.

FIG. 4 illustrates another embodiment of the control methods of the present invention. In this embodiment, a reference reflectivity is measured in control block 20 on a substrate that simulates the film stack without photoresist. Reflectivity data from test substrates with photoresist or actual production substrates with photoresist is then measured in control block 2. Absorption parameters are then calculated in control block 22 from the reference reflectivity and the reflectivity with photoresist, as described above. The reflectivity data and calculated resist absorption parameters are then used to calculate a required exposure in block 24.

Exposure is calculated in block 24 by matching current reflectivity data with baseline reflectivity data, as described above with reference to FIGS. 2 and 3, and by using computer programs, stored in computer 107, that correlate lithographic results to absorption parameters. Commercially available computer modeling software, for example PROLITH/2 from FINLE Technologies and DEPICT from Technology Modeling Associates, may be used to calculate a desired exposure from a given set of A, B, and C absorption parameters and the substrate reflectivity. Combining the reflectivity and absorption calculations results in a calculated exposure that accounts for changes in the substrate, which more strongly effect reflection, and changes in the photoresist, which more strongly effect absorption. The remaining steps in FIG. 4 are similar to those in FIG. 2. As before, when the required exposure is achieved the exposure is stopped.

Figure 5:
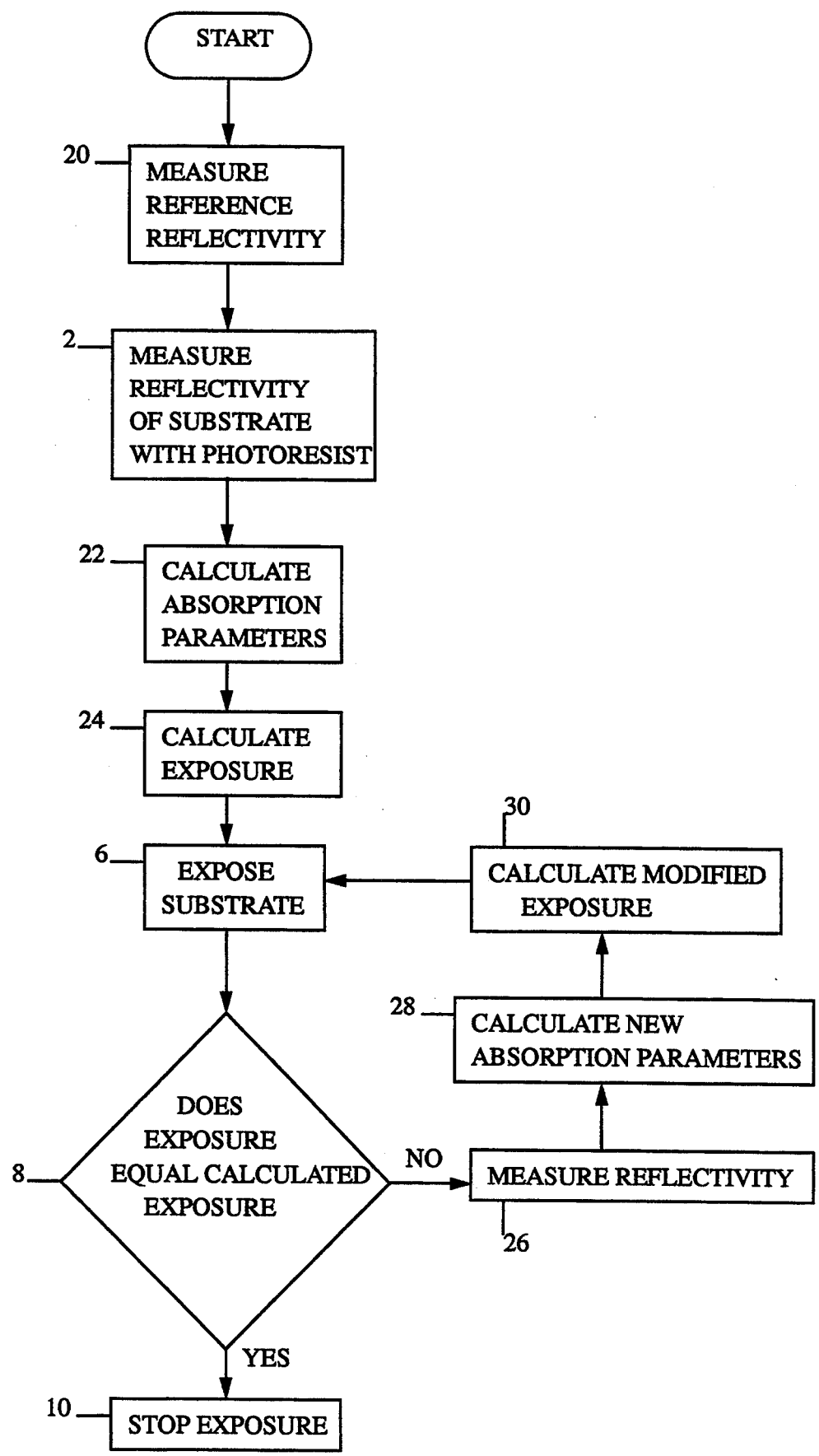
FIG. 5 is another embodiment of the exposure control method shown in FIG. 4.

The control method shown in FIG. 5 is a closed loop feedback version of the method shown in FIG. 4. If the desired exposure has not yet been reached, control passes from decision block 8 to block 26 where reflectivity is measured during the exposure of the production substrate. New absorption parameters are calculated in block 28 by using the reference reflectivity obtained in block 20 and the reflectivity data obtained in block 26. In order to calculate absorption parameters, data from substantially exposed resist is required. Thus, since the reflectivity data obtained in block 26 is collected during exposure and prior to complete exposure, the reflectivity for complete exposure must be estimated. The reflectivity data from block 26 is thus extrapolated to create data points for complete exposure. Purely mathematical extrapolations may be used or extrapolations that are based, in part, on prior exposure data may be used.

A modified calculated exposure is then calculated in block 30 using the reflectivity data from block 26, the new absorption parameters from block 30 and the procedures described above for the calculations made in block 24. Alternatively, control may proceed directly from reflectivity measurement block 26 to calculation block 30 without calculating new absorption parameters. In this case, the modified calculated exposure is calculated using the absorption parameters calculated in block 22 and the new reflectivity data collected in block 26. In yet another embodiment, the modified calculated exposure in block 30 may be calculated without using absorption parameters, thus, similar to the method used in calculation block 14 in FIG. 3. In all cases, control then passes back to exposure block 6 and the feedback loop continues until the actual exposure reaches the calculated exposure and exposure is stopped.

Figure 6:
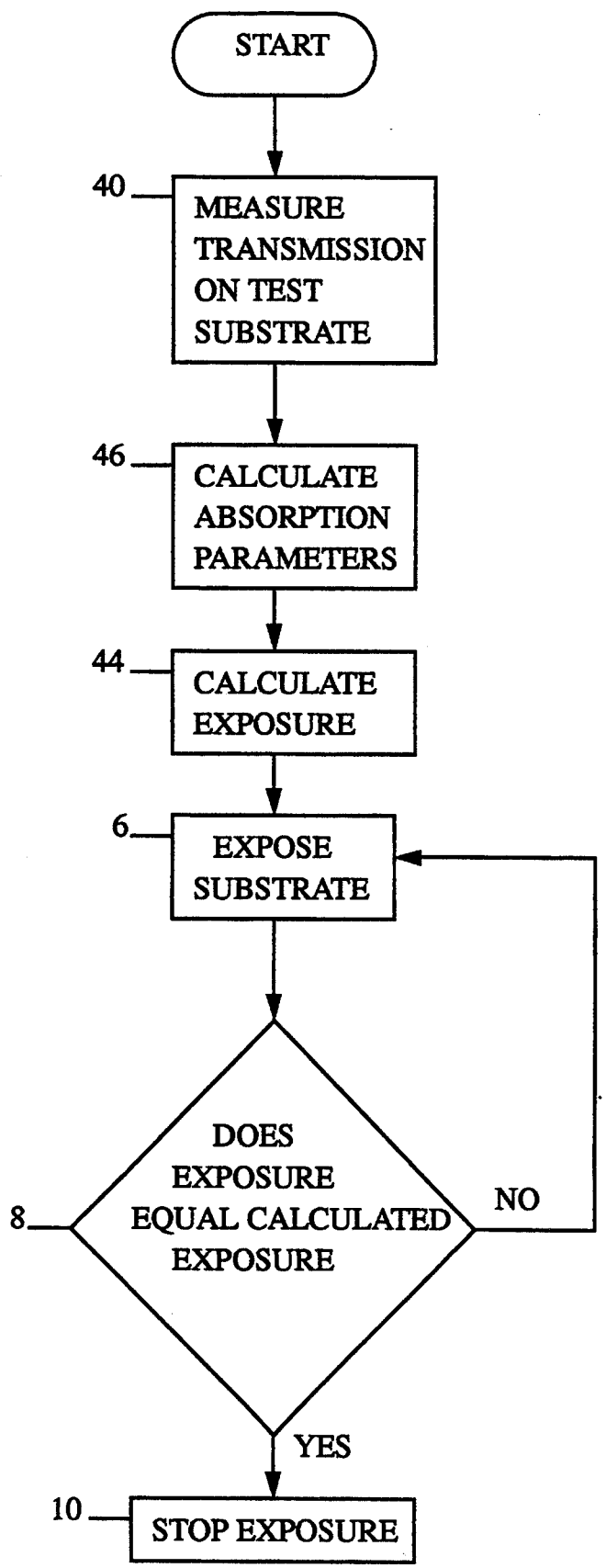
FIG. 6 is another embodiment of an exposure control method used by the tool in FIG. 1 according to the present invention.

Yet another embodiment of the exposure control method of the present invention is shown in FIG. 6. First, transmission as a function of exposure time is measured in block 40. The transmission measurement in block 40 is made on a special test substrate as previously described. Then, absorption parameters are calculated in block 46 from the transmission data. An exposure calculation is then made in block 44. Then, exposure proceeds in block 6 until the calculated exposure is reached in block 8 and exposure is stopped.

The exposure calculation in block 44 may be made either by using absorption modeling software that has been previously described or by using absorption modeling software in conjunction with predetermined baseline transmission data. If baseline data is used, the data is obtained in part from an exposure matrix on a first baseline substrate to determine the optimal exposure time. In addition, baseline transmission data is also collected from a second baseline substrate. The baseline transmission magnitude and total transmission (integral of the transmission versus time curve) are then obtained from the second baseline substrate for an exposure time that equals the optimal exposure time calculated from the first baseline substrate.

A calculated exposure time may then be calculated in block 44 by matching the baseline transmission magnitude and/or the total transmission to the current transmission data measured in block 40. The corresponding current exposure time is the exposure time that yields transmission data from block 40 that matches the baseline transmission data at the optimal baseline exposure time. The corresponding current exposure time may be used as the calculated exposure time in block 44 or in conjunction with modeling programs to calculate an exposure in block 44. The baseline absorption parameters may also be compared to the current parameters obtained in block 46 in order to aid, with the use of modeling programs, the exposure calculation in block 44.

Figure 7:
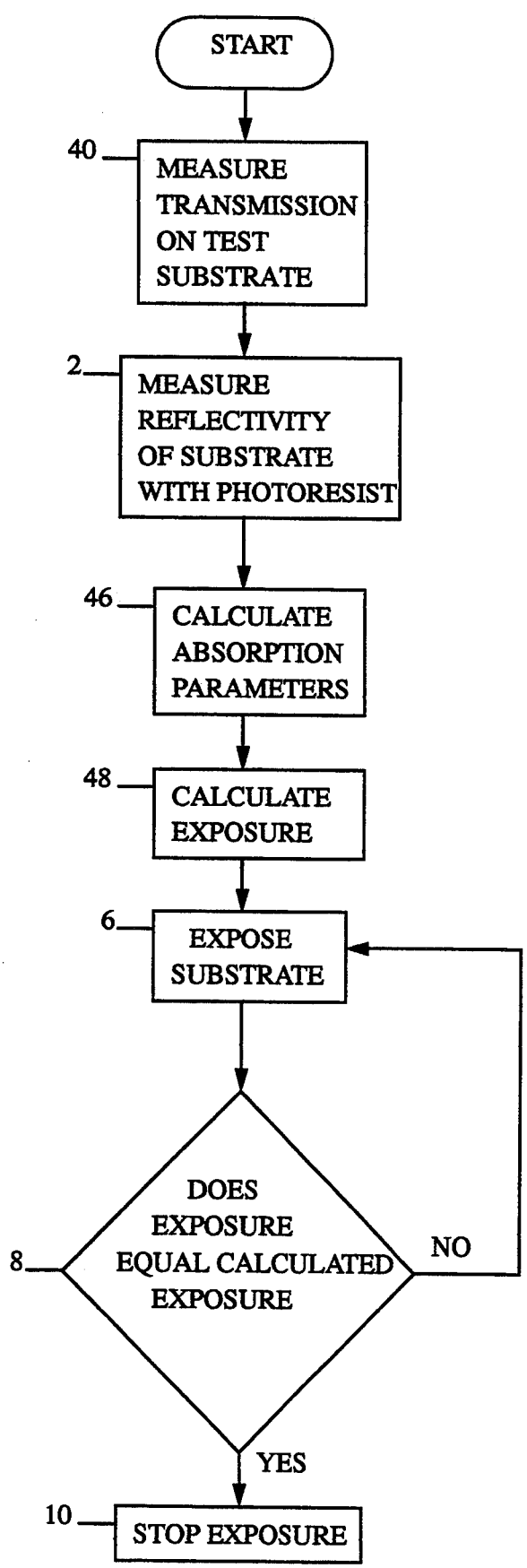
FIG. 7 is another embodiment of an exposure control method used by the tool in FIG. 1 according to the present invention.

The control method shown in FIG. 6 may be modified as shown in FIG. 7. The method of FIG. 7 incorporates a reflectivity measurement in block 2. The reflectivity measurement is made on a substrate that has the entire film stack including photoresist and may be obtained from either a test substrate or a small area of a production substrate. A calculated exposure is then obtained in control block 48. The calculation in block 48 is made using reflectivity data from block 2, predetermined baseline reflectivity data, predetermined baseline transmission data, and absorption parameters obtained using the procedures previously described. Alternatively, not all the data need be used in the exposure calculation. For example, the calculation may be made from only a portion of the data, such as the reflectivity data and the absorption parameters. Control then proceeds as described above for the method shown in FIG. 6.

Figure 8:
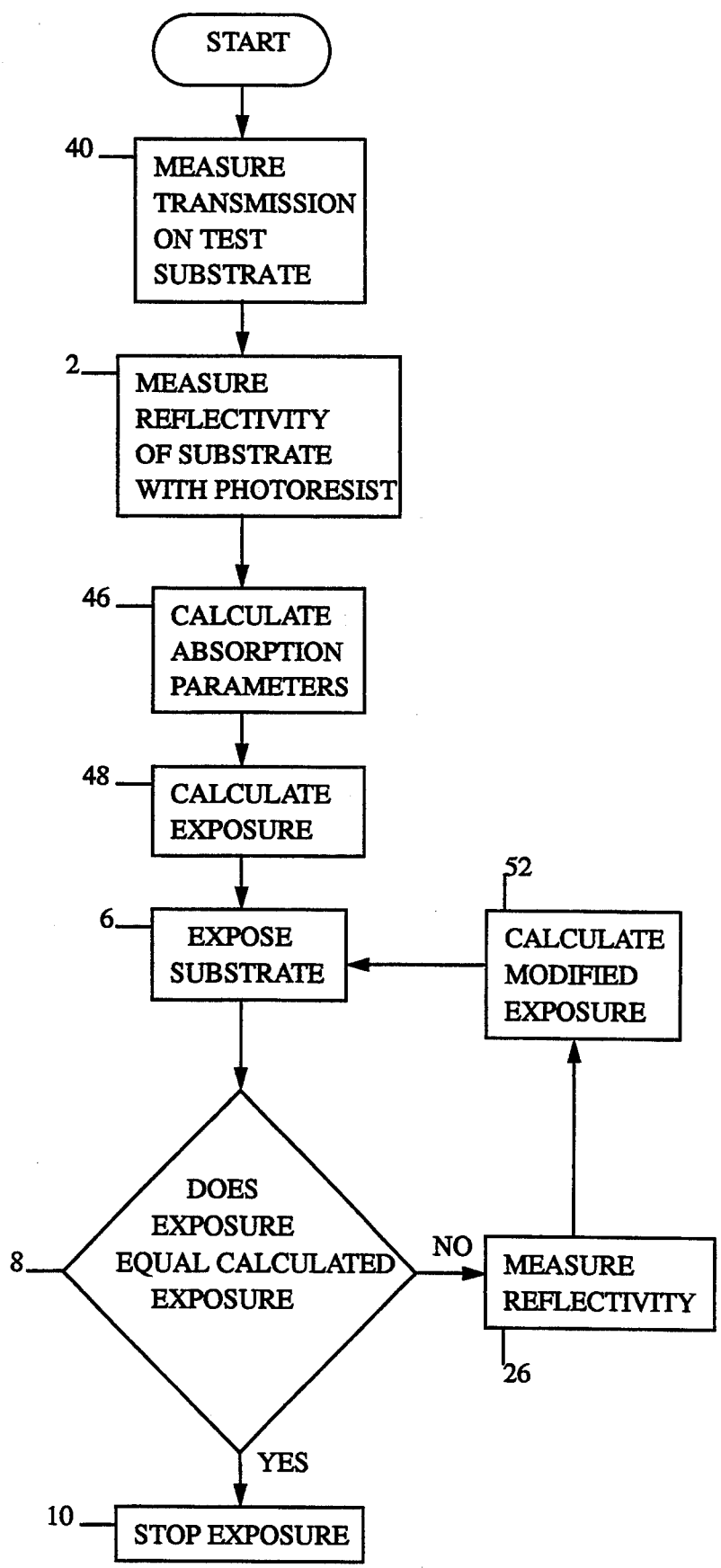
FIG. 8 is another embodiment of the exposure control method shown in FIG. 7.

As shown in FIG. 8, closed loop feedback may be added to the control method shown in FIG. 7. Control proceeds in the method shown in FIG. 8 similar to the method of FIG. 7 until decision block 8 is reached. If the actual exposure has not reached the calculated exposure, control passes to measurement block 26. Reflectivity data is measured in block 26 during exposure. Control then passes to calculation block 52 where a modified exposure may be calculated. The calculation in block 52 may be similar to one of the methods described for calculation block 48, except the measured reflectivity data is obtained from block 26 instead of block 2. Control then returns to exposure block 6 and the closed loop system may continue until the calculated exposure is reached and exposure is stopped in block 10.

Many of the measurements made in the methods described above only need to be made at a frequency required to insure accurate measurements and process control. For example, measurements in blocks 2, 20 and 40 may, depending on the application and user's requirements, be made once every lot (a group of substrates), once a shift, once a day, multiple spots per substrate, etc.

Further modifications and alternative embodiments of this invention will be apparent to those skilled in the art in view of this description. Accordingly, this description is to be construed as illustrative only and is for the purpose of teaching those skilled in the art the manner of carrying out the invention. It is understood that the forms of the invention herein shown and described are to be taken as the presently contemplated embodiments. For example, equivalent elements, materials or methods may be substituted for those illustrated and described herein, and certain features or methods of the invention may be utilized independently of the use of other features or methods, all as would be apparent to one skilled in the art after having the benefit of this description of the invention.

What is claimed is:

1. A photolithography exposure apparatus, comprising:
an imaging system for projecting an image from a mask onto a photosensitive layer of a substrate, said system comprising:
an illumination source;
a lens, for directing illumination from said illumination source onto said photosensitive layer;
a mask support structure for holding said mask at a first location; and
a chuck for supporting said substrate; and
a transmission detector positioned to measure illumination, from said illumination source, that passes through said photosensitive layer.

2. The apparatus of claim 1, further comprising:
a computer connected to said transmission detector for calculating absorption parameters of said photosensitive layer.

3. The apparatus of claim 2, wherein said absorption parameters comprise a bleachable resist absorption coefficient, a non-bleachable resist absorption coefficient and a kinetic exposure rate constant.

4. The apparatus of claim 2, further comprising:
a reflectance detector positioned to measure illumination that reflects from said photosensitive layer and said substrate.

5. The apparatus of claim 4, wherein said reflectance detector is connected to said computer.

6. The apparatus of claim 5, wherein said transmission detector is located proximate said chuck.

7. The apparatus of claim 6, further comprising a beam splitter for directing illumination to said reflectance detector.

8. The apparatus of claim 6, wherein:
said beam splitter is positioned between said first location and said illumination source;
said reflection detector is aligned to detect light split from said beam splitter; and
said transmission detector is located within said chuck.

9. A photolithography exposure apparatus, comprising:
means for producing a patterned image on a photosensitive layer of a substrate;
a transmission detector for measuring absorption parameters of said photosensitive layer; and
a reflectance detector for measuring a reflectivity of said substrate.

* * * * *